US008001501B2

(12) United States Patent
Dorsch et al.

(10) Patent No.: US 8,001,501 B2
(45) Date of Patent: Aug. 16, 2011

(54) METHOD FOR CIRCUIT DESIGN

(75) Inventors: Rainer Dorsch, Dettenhausen (DE);
Marta Junginger, Altdorf (DE); Philipp Salz, Boeblingen (DE); Andreas Wagner, Boeblingen (DE); Gerhard Zilles, Jettingen (DE)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 12/122,785

(22) Filed: May 19, 2008

(65) Prior Publication Data
US 2009/0288046 A1    Nov. 19, 2009

(51) Int. Cl.
*G06F 17/50* (2006.01)
*G06F 9/45* (2006.01)

(52) U.S. Cl. ........ 716/104; 716/102; 716/103; 716/105; 716/106; 716/108; 716/111; 716/117; 716/138

(58) Field of Classification Search ................... 716/102, 716/103, 104, 108, 111, 117, 138
See application file for complete search history.

(56) References Cited

U.S. PATENT DOCUMENTS

| | | | | |
|---|---|---|---|---|
| 5,991,909 | A * | 11/1999 | Rajski et al. | 714/729 |
| 6,532,571 | B1 * | 3/2003 | Gabrielson et al. | 716/106 |
| 6,631,344 | B1 * | 10/2003 | Kapur et al. | 703/22 |
| 6,671,838 | B1 * | 12/2003 | Koprowski et al. | 714/726 |
| 6,823,502 | B2 * | 11/2004 | Wingren et al. | 716/102 |
| 7,210,109 | B2 * | 4/2007 | Caron et al. | 716/107 |
| 7,231,621 | B1 * | 6/2007 | Herron et al. | 716/108 |
| 7,340,700 | B2 * | 3/2008 | Emerson et al. | 716/111 |
| 7,673,264 | B1 * | 3/2010 | Darbinyan et al. | 716/138 |
| 7,757,198 | B1 * | 7/2010 | Zhao et al. | 716/103 |
| 2006/0041582 | A1 * | 2/2006 | Hekmatpour | 707/102 |
| 2010/0218146 | A1 * | 8/2010 | Platzker et al. | 716/4 |

OTHER PUBLICATIONS

Touba et al.; "Automated logic synthesis of random pattern testable circuits"; Publication Year: 1994; Test Conference, 1994. Proceedings., International; pp. 174-183.*
Lai et al.; "Hardware efficient LBIST with complementary weights"; Publication Year: 2005; Computer Design: VLSI in Computers and Processors, 2005. ICCD 2005. Proceedings. 2005 IEEE International Conference on; pp. 479-481.*
Xinli Gu; "RT level testability-driven partitioning"; Publication Year: 1995; VLSI Test Symposium, 1995. Proceedings., 13th IEEE; pp. 176-181.*
Zhang et al.; Structure Design and Optimization of 2-D LFSR-Based Multisequence Test Generator in Built-In Self-Test; Publication Year: 2008; Instrumentation and Measurement, IEEE Transactions on; vol. 57, Issue: 3; pp. 651-663.*

* cited by examiner

*Primary Examiner* — Helen Rossoshek
(74) *Attorney, Agent, or Firm* — Schmeiser, Olsen & Watts

(57) ABSTRACT

A method for designing a circuit. The method includes (i) providing a netlist of a design and (ii) dividing the netlist into N user logics, N being a positive integer. After said dividing the netlist is performed, the N user logics in N macro test wrappers are instantiated resulting in N instantiated logics. After said instantiating the N user logics is performed, the N instantiated logics are processed. After said processing is performed, a result of said processing is back-annotated to the netlist.

16 Claims, 5 Drawing Sheets

US 8,001,501 B2

METHOD FOR CIRCUIT DESIGN

FIELD OF THE INVENTION

The present invention relates generally to circuit design processes and more particularly to circuit design processes that are faster than those of the prior art.

BACKGROUND OF THE INVENTION

A conventional circuit design process usually starts with the synthesis of the HDL input files. Output of the synthesis step are Macro IBM VLSI Integrated Model (VIM) netlists for modeling the semiconductor fabrication of the circuit, DFTS/TLI (Design For Test Synthesis/Top Level Insertion) for adding testability features to the netlist, Chip-VIM netlist with test points for model the semiconductor fabrication of the circuit, etc. It may tale many days to process. Therefore, there is a need for a circuit design process that takes shorter period of time than the design process of the prior art.

SUMMARY OF THE INVENTION

The present invention provides a circuit design method, comprising providing a netlist of a design; dividing the netlist into N user logics, N being a positive integer; after said dividing the netlist is performed, instantiating the N user logics in N macro test wrappers resulting in N instantiated logics; after said instantiating the N user logics is performed, processing the N instantiated logics; and after said processing is performed, back-annotating a result of said processing to the netlist.

The present invention also provides a circuit design method, comprising providing a netlist of a design, wherein the netlist includes M non-customized test cells, M being a positive integer; specifying a minimum probability value less than 1; locating L test points in the netlist, L being a positive integer not greater than M, wherein each test point of the L test points has a high probability for a logic value selected from the group consisting of 0 and 1, and wherein the high probability is at least the minimum probability value; and coupling L non-customized test cells of the M non-customized test cells one-to-one to the L test points resulting in (i) the L non-customized test cells becoming L customized test cells and (ii) each test point of the L test points having a lower probability for the associated logic value than without said coupling.

The present invention provides a circuit design process that takes shorter period of time than the design process of the prior art.

DETAILED DESCRIPTION OF THE INVENTION

Figure 1:
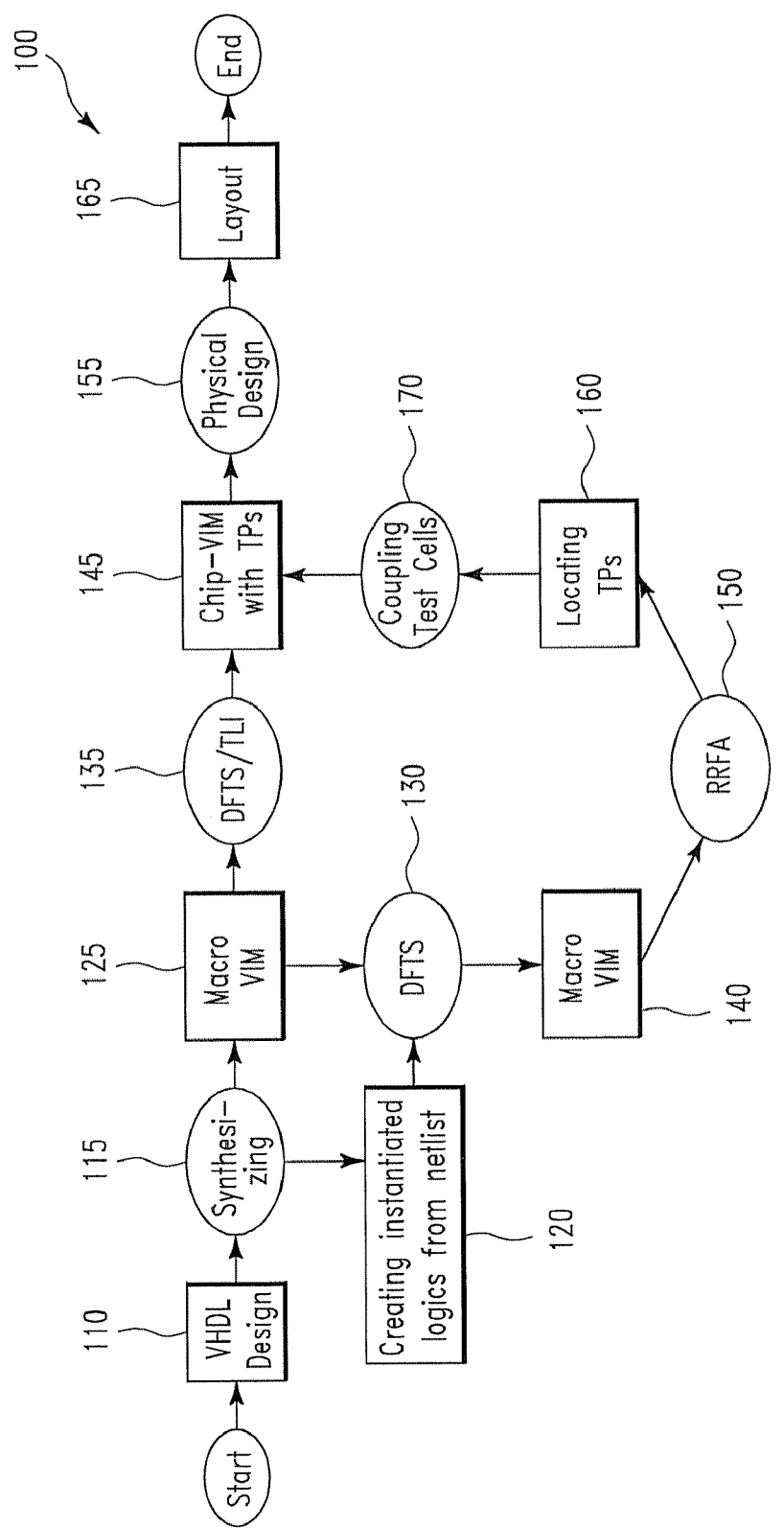
FIG. 1 shows a flowchart that illustrates a chip design process, in accordance with embodiments of the present invention.

FIG. 1 shows a flowchart 100 that illustrates a chip design process, in accordance with embodiments of the present invention. More specifically, with reference to FIG. 1, the flowchart 100 starts with step 110 in which a design of a chip (not shown) is created and described in a Hardware Description Language (HDL) such as Verilog or VHDL at Register Transfer Level (RTL). This design can be referred to as a RTL Design 110. The RTL Design 110 is a description of the chip which functionally describes the chip.

Figure 2:
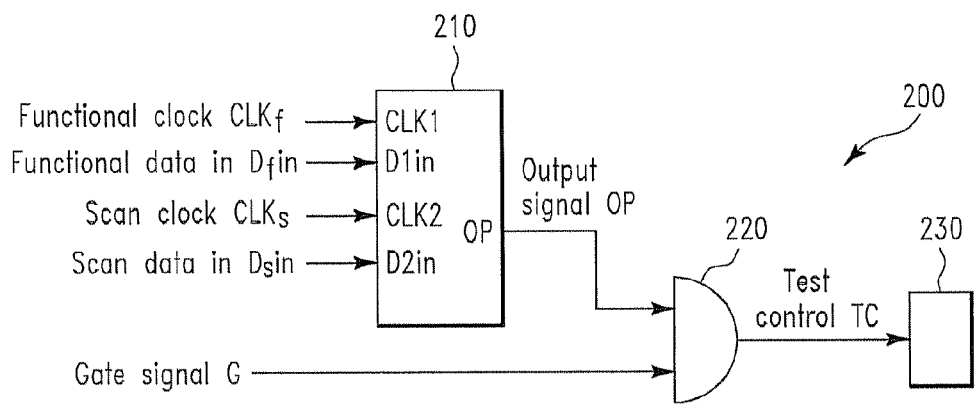
FIG. 2 shows a block diagram of a test cell, in accordance with embodiments of the present invention.

FIG. 2 shows a block diagram of a test cell 200, in accordance with embodiments of the present invention. More specifically, with reference to FIG. 2, the test cell 200 comprises a latch 210, an AND Gate 220 electrically connected to the latch 210, and a terminator 230 electrically connected to the AND Gate 220. In one embodiment, the RTL Design 110 of FIG. 1 comprises the descriptions of M test cells (similar to the test cell 200 of FIG. 2), or it can be simply stated that the M test cells 200 are part of the RTL Design 110. M is a positive integer. In one embodiment, for each of the M test cells 200, the output may be connected to other parts of the chip at later steps.

In one embodiment, the latch 210 comprises four inputs CLK1, D1in, CLK2, and D2in and an output OP. The inputs CLK1 and D1in receive a functional clock signal $CLK_f$ and a functional data in signal $D_f$in, respectively. The inputs CLK2 and D2in receive a scan clock signal $CLK_s$ and a scan data in signal $D_s$in, respectively. The AND Gate 220 receives as input the output OP of the latch 210. The AND Gate 220 also receives as input a LBIST (Logic Built-In Self-Test) gate signal G. The terminator 230 receives as input a test control signal TC from the AND Gate 220. The use of terminator circuit 230 avoids open output warnings during compilation and it is used as flag for unused test cells. It should be noted that the test control signal TC may be connected to other parts of the chip at the later steps. In one embodiment, the latch 210 is part of a scan chain (not shown) of the chip. In one embodiment, the M test cells 200 shares as input the same LBIST gate signal G.

With reference to FIG. 1, after the RTL Design 110 is created in step 110, in one embodiment, in step 115, the RTL Design 110 is synthesized. The RTL Design 110 can be synthesized by a synthesis tool (not shown). More specifically, the synthesis tool receives the RTL Design 110 and then outputs a description (netlist) of the chip which corresponds to the actual chip being formed on a semiconductor wafer. A netlist is a detailed list of circuit elements of the chip and the interconnections among the circuit elements. In one embodiment, the netlist created by step 115 (can also be referred to as the netlist 115) serves as input of steps 120 and 125.

Figure 3:
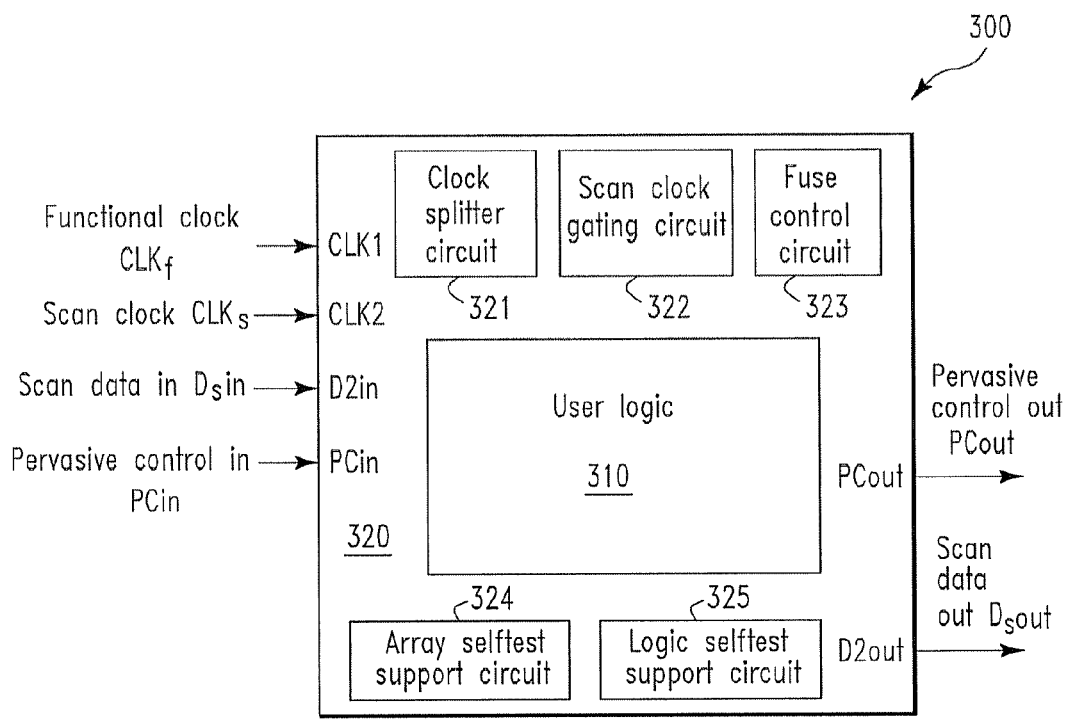
FIG. 3 shows a block diagram of an instantiated logic as one embodiment of a plurality of instantiated logics, in accordance with embodiments of the present invention.

In step 120, in one embodiment, N instantiated logics are created from the netlist 115, N is a positive integer. FIG. 3 shows a block diagram of an instantiated logic 300 as one embodiment of the N instantiated logics, in accordance with embodiments of the present invention. More specifically, with reference to FIGS. 1-3, in step 120, the netlist 115 is divided into N user logics 310. Each of the N user logics 310 can comprise some of the M test cells 200. Next, the N user logics 310 are instantiated in N macro test wrappers 320 resulting in the N instantiated logics 300. The N macro test wrappers 320 can be similar to one another. Each of the N macro test wrappers 320 can comprise a clock splitter circuit 321, a scan clock gating circuit 322, a fuse control circuit 323, an array selftest support circuit 324, and a logic selftest support circuit 325. Each of the N instantiated logics 300 comprises certain parts of the chip.

Also in step 120, signals (e.g., functional clock $CLK_f$, scan clock $CLK_s$) are added to each of the N instantiated logics 300 so as to test the N instantiated logics 300 independently and simultaneously. More specifically, with reference to FIG. 3, the instantiated logic 300 receives the functional clock signal $CLK_f$, the scan clock signal $CLK_s$, the scan data in signal $D_s$in, and the pervasive control in signal PCin at inputs CLK1, CLK2, D2in, and PCin, respectively. The instantiated logic 300 generates a scan data out signal $D_s$out and a pervasive control out signal PCout at outputs D2out and PCout, respectively.

Next, in step 130, in one embodiment, for each of the N instantiated logics 300, a DFTS (Design For Test Synthesis) run is performed to add testability features (which are not part of the RTL Design 110) to the instantiated logic. The N DFTS runs performed on the N instantiated logics 300 can be performed independently and simultaneously.

Next, in step 140, in one embodiment, for each of the N instantiated logics, a Macro VIM (VLSI Integrated Model) netlist run is performed on the result of the DFTS run so as to model the semiconductor fabrication of the chip resulting in N VIM files that include technical representations of the N instantiated logics.

Next, in step 150, in one embodiment, for each of the N instantiated logics, a RRFA (Random resistant fault analysis) run is performed on the associated VIM file so as to detect and identify signals of the instantiated logic that are difficult to test with random patterns. More specifically, in one embodiment, the RRFA program detects and identifies signals of the instantiated logic that have high probability for 1 (high) or 0 (low).

Figure 4A:
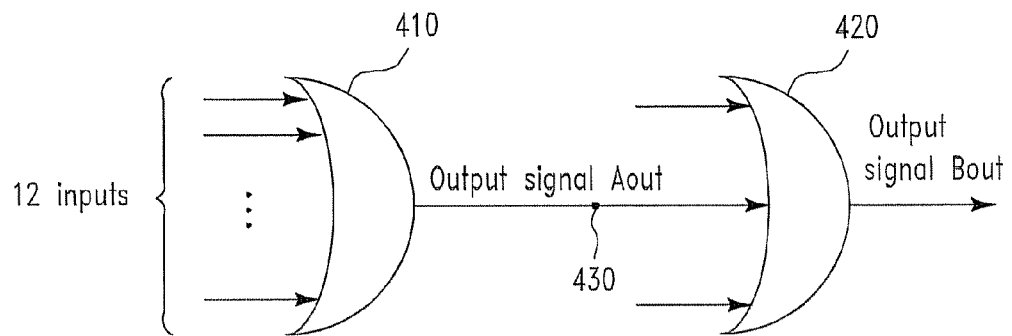
FIG. 4A shows a first OR Gate and a second OR Gate of an instantiated logic coupled together, in accordance with embodiments of the present invention.

As an example, assume that the instantiated logic comprises a first OR Gate 410 and a second OR Gate 420 coupled together as shown in FIG. 4A. Assume further that the OR Gate 410 has 12 inputs and the OR Gate 420 has 3 inputs. The OR Gate 420 receives as input an output signal Aout of the OR Gate 410. Assume further that a high probability for 1 or 0 is defined as a probability of at least a pre-specified minimum probability value (e.g., 90%) of having 1 or 0. It can be seen in FIG. 4A that, with a random test pattern at the inputs of the OR Gate 410 and the OR Gate 420, the output signal Aout of the OR Gate 410 has a high probability to be at up level (i.e., the output signal Aout has high probability for 1). As a result, the OR gate 420 is not likely to be tested with the scenario in which its input signal Aout is low. In this example, in step 150, the output signal Aout is detected and identified as a signal having high probability for 1 because the probability of signal Aout being low (i.e., all 12 inputs of OR gate 410 being low) is clearly less than 10% resulting in the probability of signal Aout being high being higher than the pre-specified minimum probability value of 90% (i.e., signal Aout has high probability for 1).

In step 160, in one embodiment, for each of the N instantiated logics, test points are located. A test point is a node to be controlled or observed. The test points can be located on the signals detected and identified as having high probability for 1 or 0. If a test point is located on a signal that has high probability for 1 or 0, then that test point is considered having high probability for 1 or 0, respectively. In the example above, with reference to FIG. 4A, a test point 430 located on the output signal Aout in step 160.

Figure 4B:
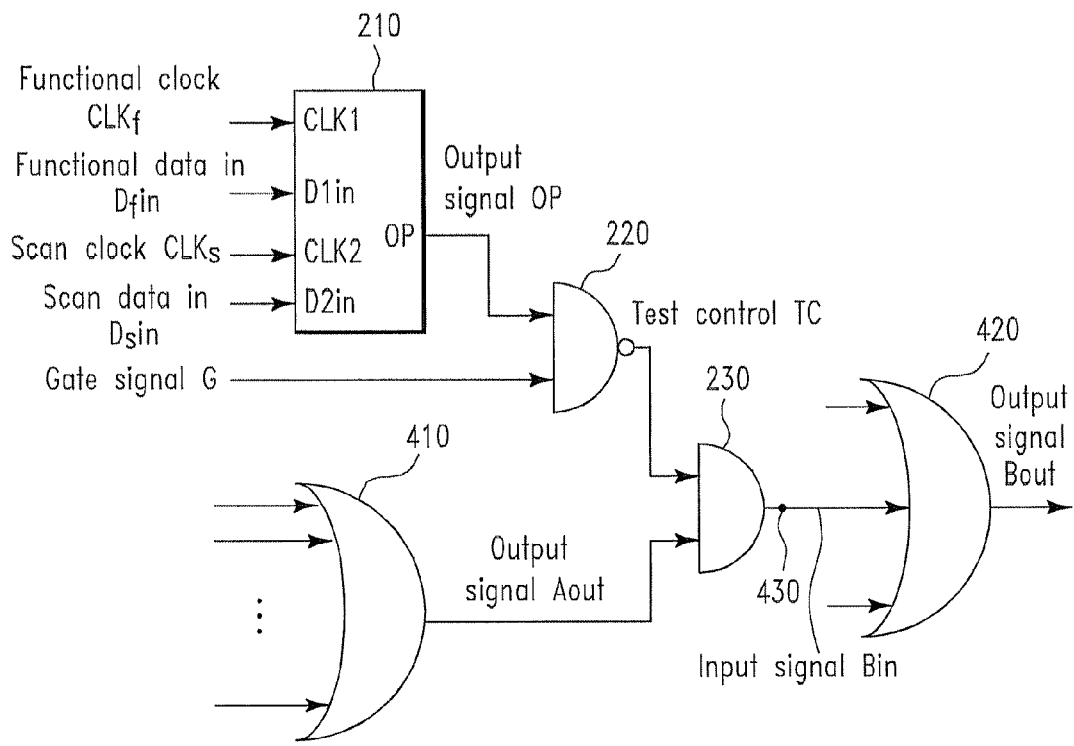
FIG. 4B shows a customized test cell coupled to a test point of the instantiated logic of FIG. 4A, in accordance with embodiments of the present invention.

Next, in step 170 (FIG. 1), in one embodiment, for each test point of the N instantiated logics, a non-customized test cell (similar to the test cell 200 of FIG. 2) of the M non-customized test cells 200 is used to couple to the test point. In the example above, with reference to FIG. 4A, for the test point 430, a non-customized test cell of the M non-customized test cells 200 which is part of the instantiated logic containing the test point 430 is coupled to the test point 430 as shown in FIG. 4B. More specifically, a detection for a first non-customized test cell of the M test cells 200 is performed. The detection can be performed using the LBIST gate signal G of the M test cells 200. Next, after the first non-customized test cell is detected, the first non-customized test cell is coupled to the test point 430 (details below). After the coupling of the first non-customized test cell to the test point 430 is performed, the test point 430 has a lower probability for 1 than without said coupling. In short, in this case, a test control point AND gate 230 is inserted as described in FIG. 4B, to control this output of Gate 410 to low level. This will increase the testability of OR gate 420. The Gate 220 is converted to a NAND Gate in this case to feed a down level to one input of Gate 230. Also after the coupling of the first non-customized test cell to the test point 430 is performed, the first test cell can be referred to as a first customized test cell and will not be used again to couple to another test point.

In one embodiment, the coupling of the first non-customized test cell to the test point 430 is performed as follows. The terminator 230 of the detected first non-customized test cell is converted into an AND Gate 230 and inserted at the test point 430 as shown in FIG. 4B, the AND gate 220 is converted to an NAND gate 220, wherein a first input of the AND Gate 230 receives the test control TC from the NAND Gate 220, a second input of the AND Gate 230 receives the output signal Aout from the OR Gate 410, and an output of the AND Gate 230 generates the input signal Bin to the OR Gate 420 (i.e., the output of the AND Gate 230 is coupled to the test point 430).

In the example described above, with reference to FIG. 4C, assume further that the instantiated logic further comprises a first AND Gate 410' and a second AND Gate 420' coupled together as shown in FIG. 4C. Assume further that the AND Gate 410' has 12 inputs and the AND Gate 420' has 3 inputs. The AND Gate 420' receives as input an output signal Aout of the AND Gate 410'. It can be seen in FIG. 4C that, with a random test pattern at the inputs of the AND Gate 410', the output signal Aout of the AND Gate 410' has a high probability (more than 90%) to be at low level (i.e., the output signal Aout has high probability for 0). As a result, the AND gate 420' is not likely to be tested with the scenario in which its input signal Aout is high. In this example, in step 150, output signal Aout of the AND Gate 410' is detected and identified as a signal having high probability for 0.

Figure 4C:
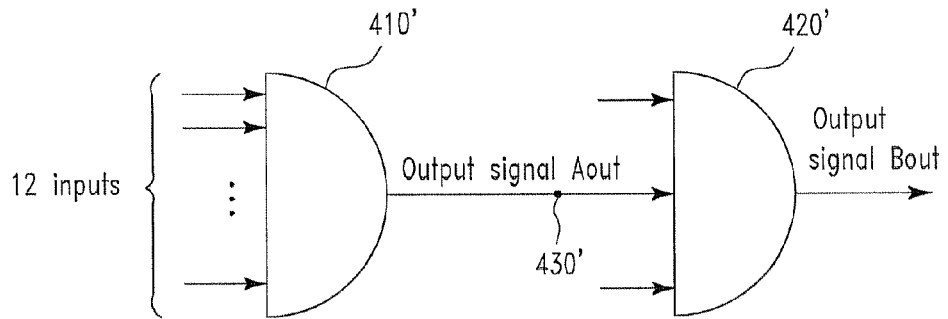
FIG. 4C shows a first AND Gate and a second AND Gate of an instantiated logic coupled together, in accordance with embodiments of the present invention.

In step 160 (FIG. 1), in the example above, with reference to FIG. 4C, a test point 430' is placed on the output signal Aout of the AND Gate 410'.

Figure 4D:
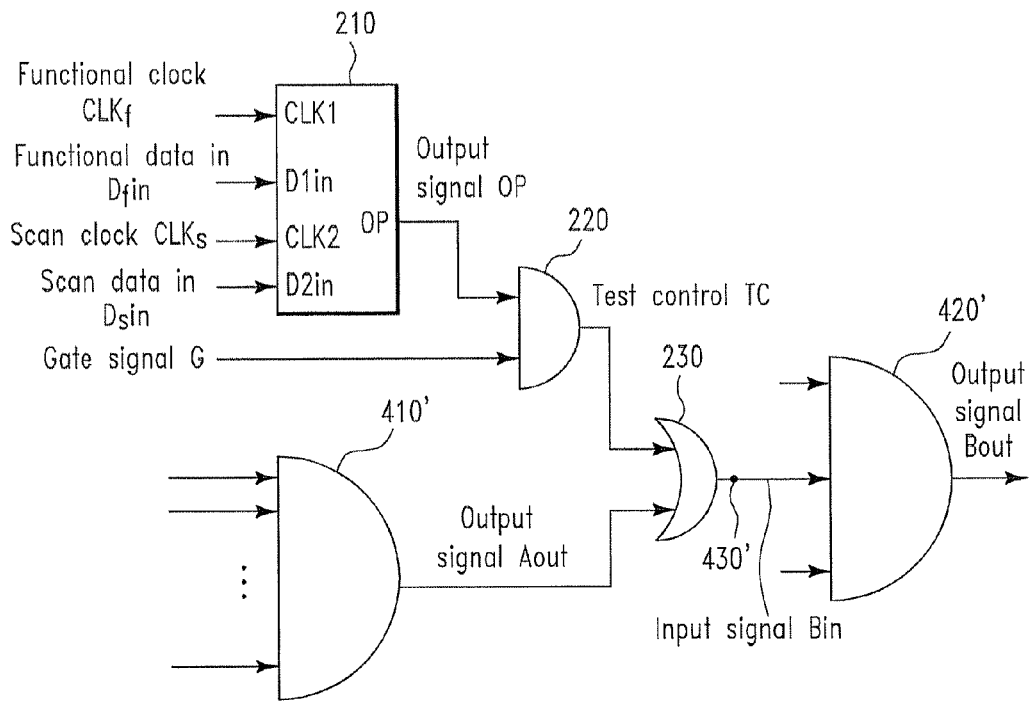
FIG. 4D shows a customized test cell coupled to a test point of the instantiated logic of FIG. 4C, in accordance with embodiments of the present invention.

In step 170 (FIG. 1), in the example above, with reference to FIG. 4D, for the test point 430', a second non-customized test cell of the M non-customized test cells 200 which is part of the instantiated logic containing the test point 430' is coupled to the test point 430' as shown in FIG. 4D. More specifically, first, a detection for the second non-customized test cell of the M test cells 200 is performed. The detection can be performed using the LBIST gate signal G of the M test cells 200. Next, after the second non-customized test cell is detected, the second non-customized test cell is coupled to the test point 430' as shown in FIG. 4D (details below). After the coupling of the second non-customized test cell to the test point 430' is performed, the test point 430' has a lower probability for 0 than without said coupling, and the second test cell can be referred to as a second customized test cell and will not be used again to couple to another test point.

In one embodiment, the coupling of the second non-customized test cell to the test point 430' is performed as follows. The terminator 230 of the detected second non-customized test cell is converted into an OR Gate 230 and inserted at the test point 430' as shown in FIG. 4D, wherein a first input of the OR Gate 230 receives the test control TC from the AND Gate 220, a second input of the OR Gate 230 receives the output signal Aout from the AND Gate 410', and an output of the OR Gate 230 generates the input signal Bin to the AND Gate 420' (i.e., the output of the OR Gate 230 is coupled to the test point 430').

In one embodiment, the LBIST gate signal G is used for activating the customized test cells during test runs of the chip, as well as for deactivating the customized test cell during the functional mode of the chip (i.e., the customized test cells can be hidden for logic equivalent runs via the LBIST gate signal G).

In one embodiment, step 170 is performed on the Chip-VIM 145 (from step 135), which is already in process, by customizing the N instantiated logics with non-customized test cells with test point information 160 gathered from step 150.

In step 145, in one embodiment, a Chip-VIM with test points run is performed so as to model the semiconductor fabrication of the chip resulting in a VIM file that includes technical representations of the complete chip.

Next, in step 155, in one embodiment, physical design of the chip is performed on the resultant VIM file in step 145. More specifically, the physical design involves conventional partitioning, floor planning, placement, and routing processes.

Next, in step 165, in one embodiment, a layout run is performed on the result of the physical design step 155 so as to develop an efficient layout.

In the embodiments described above, steps 130, 140, 150, 160, and 170 can be performed independently and simultaneously for the N instantiated logics. Therefore, the run time spent on steps 130, 140, 150, 160, and 170 for the N instantiated logics is shorter than that for the case in which the entire netlist 115 goes through step 135 with only one RRFA process step applied on this netlist.

In the embodiments described above, the netlist 115 serves as input of the step 120. It should be noted that, the netlist 115 also serves as input of the step 125.

In step 125, in one embodiment, a Macro VIM run is performed on the netlist 115 so as to model the semiconductor fabrication of the chip resulting in a VIM file that include technical representations of the chip. This VIM file is generated as input to steps 130 and 135.

Next, in step 135, a DFTS/TLI (Design For Test Synthesis/Top Level Insertion) run is performed to add testability features (which are not part of the RTL Design 110) to the netlist 115. The result of the DFTS/TLI run is generated as input to the step 145. Next, steps 145, 155, and 165 are performed. Step 125 and 135 combines the first user logic with the pseudo test wrappers (also VIM's which are generated in step 115) and runs this combinations through a DFTS step, where step 125 and 135 have to be performed on the whole chip VIM (this step takes a lot of time).

In summary, the netlist 125 (i.e., the netlist after step 125 is performed) is divided into the user logics 310 that are subsequently instantiated in the macro test wrappers 320 resulting in the instantiated logics 300. The naming convention for each of the instantiated logics 300 is chosen in the same way as it was in the original chip logic hierarchy. These user logics 310 of the netlist 125 can be processed in parallel. Then, the results of the RRFA step can be back-annotated to the netlist 145 (i.e., the netlist after step 145 is performed) (due to the same naming conventions) which is already in the physical design step 155. Because of the presence of the M non-customized test cells 200 in the RTL Design 110, the coupling of the non-customized test cells to test points (step 170) can be performed without adding any latches into the RTL Design 110. As a result, there is no need for rebalancing the clock tree. Also, the run time spent on steps 130, 140, 150, 160, and 170 for the N instantiated logics is shorter than that for the case in which the entire netlist 115 goes through steps 130, 140, 150, 160, and 170.

In the embodiments described above, with reference to FIG. 4B, the test point 430 and the associated test cell which is used to couple to the test point 430 reside in the same instantiated logic 300. Alternatively, the test point 430 and the associated test cell which is used to couple to the test point 430 reside in different instantiated logics 300.

Figure 5:
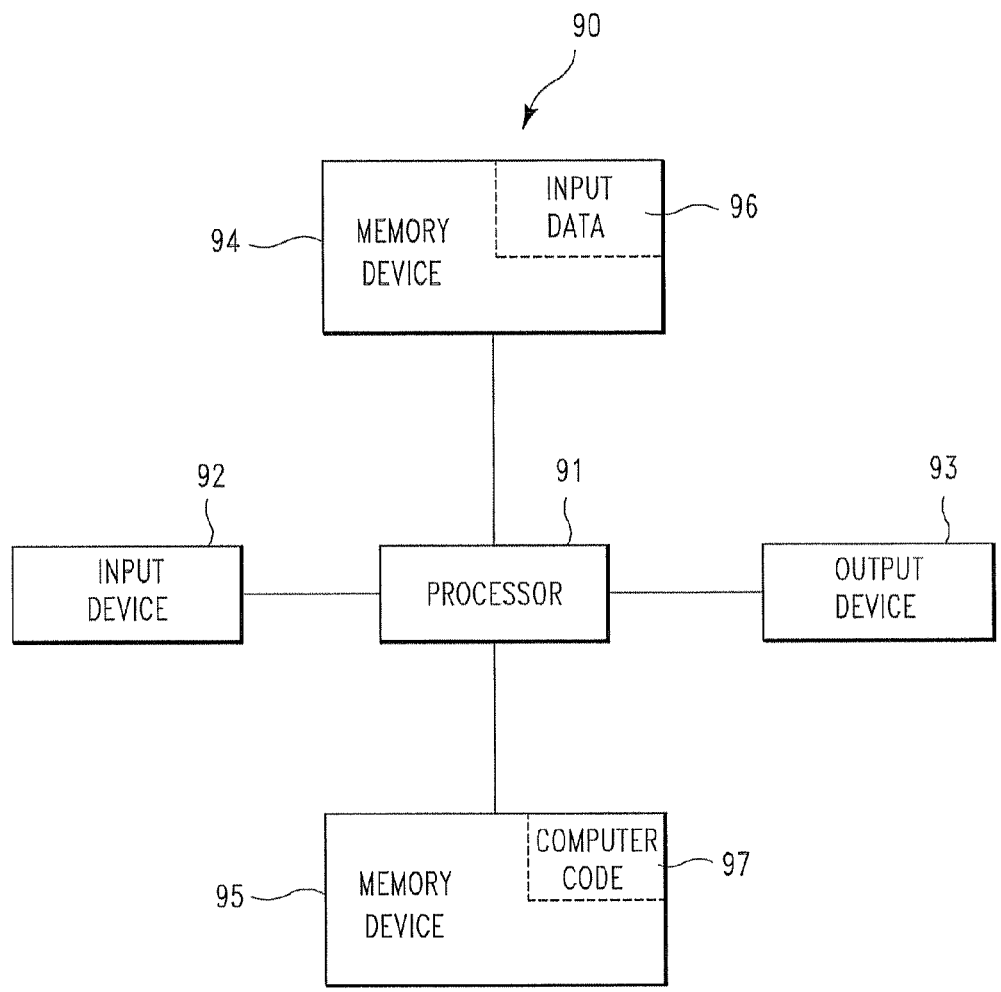
FIG. 5 illustrates a computer system used for performing a design process as illustrated in the flowchart of FIG. 1, in accordance with embodiments of the present invention.

FIG. 5 illustrates a computer system 90 used for performing a design process as illustrated in the flowchart 100 of FIG. 1, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for performing a design process as illustrated in the flowchart 100 of FIG. 1. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 5) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 5 shows the computer system 90 as a particular configuration of hardware and software, any configuration of hardware and software, as would be known to a person of ordinary skill in the art, may be utilized for the purposes stated supra in conjunction with the particular computer system 90 of FIG. 5. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A design method, said method comprising:
providing a netlist of a design;
dividing the netlist into N user logics, N being a positive integer;
after said dividing the netlist is performed, instantiating the N user logics in N macro test wrappers resulting in N instantiated logics;
after said instantiating the N user logics is performed, processing the N instantiated logics, wherein said processing the N instantiated logics comprises a processor of a computer system performing a Random Resistant Fault Analysis (RRFA) to detect and identify signals for each instantiated logic of the N instantiated logics having a logic value of 1 or 0 with a high probability of at least 90 percent; and
after said processing is performed, back-annotating a result of said processing to the netlist, wherein said result of said processing comprises the detected and identified signals.

2. The method of claim 1,
wherein said instantiating the N user logics comprises instantiating a first user logic of the N user logics resulting in a first instantiated logic of the N instantiated logics, and
wherein said instantiating the first user logic comprises choosing a naming convention for the first instantiated logic in a same way as it was in an original chip logic hierarchy.

3. The method of claim 1, wherein said processing the N instantiated logics is performed in parallel for the N instantiated logics.

4. The method of claim 1, wherein the N macro test wrappers are similar to one another.

5. The method of claim 1, wherein each macro test wrapper of the N macro test wrappers comprises a clock splitter circuit, a scan clock gating circuit, a fuse control circuit, an array self test support circuit, and a logic self test support circuit.

6. The method of claim 1, wherein the netlist includes M non-customized test cells, M being a positive integer.

7. A design method, said method comprising:
providing a netlist of a design, wherein the netlist includes M non-customized test cells, M being a positive integer;
dividing the netlist into N user logics, N being a positive integer;
after said dividing the netlist is performed, instantiating the N user logics in N macro test wrappers resulting in N instantiated logics; and
after said instantiating the N user logics is performed, processing the N instantiated logics,
wherein said processing the N instantiated logics comprises:
specifying a minimum probability value less than 1;
a processor of a computer system locating L test points in the netlist, L being a positive integer not greater than M, wherein each test point of the L test points has a high probability for a logic value selected from the group consisting of 0 and 1, and wherein the high probability is at least the minimum probability value; and
said processor coupling L non-customized test cells of the M non-customized test cells one-to-one to the L test points resulting in (i) the L non-customized test cells becoming L customized test cells and (ii) each test point of the L test points having a lower probability for the associated logic value than without said coupling netlist.

8. The method of claim 7,
wherein each non-customized test cell of the M non-customized test cells comprises (i) a latch, (ii) a cell AND gate which comprises a first input electrically coupled to the latch and a second input receiving a LBIST (Logic Built-In Self-Test) gate signal, and (iii) a terminator electrically coupled to an output of the cell AND gate, and
wherein the M cell AND gates of the M non-customized test cells are configured to receive the same LBIST gate signal.

9. The method of claim 8, wherein said coupling comprises detecting the L non-customized test cells of the M non-customized test cells using the LBIST gate signal.

10. The method of claim 9, wherein said coupling further comprises, after said detecting the L non-customized test cells is performed,
in response to a first test point of the L test points having a high probability for 1,
converting the terminator of the associated non-customized test cell into an inserted AND gate,
converting the cell AND gate of the associated non-customized test cell into a cell NAND gate,
coupling the output of the cell NAND Gate of the associated non-customized test cell to an input of the inserted AND gate, and
coupling the first test point to an output of the inserted AND gate; and
in response to a second test point of the L test points having a high probability for 0,
converting the terminator of the associated non-customized test cell into an inserted OR gate,
coupling the output of the cell AND Gate of the associated non-customized test cell to an input of the inserted OR gate, and
coupling the second test point to an output of the inserted OR gate.

11. A computer program product, comprising a computer readable tangible storage device having a computer readable program code stored therein, said computer readable program code configured to be executed by a processor of a computer system to implement a method for designing a circuit, said method comprising:
providing a netlist of a design of the circuit;
dividing the netlist into N user logics, N being a positive integer;
after said dividing the netlist is performed, instantiating the N user logics in N macro test wrappers resulting in N instantiated logics;
after said instantiating the N user logics is performed, processing the N instantiated logics, wherein said processing the N instantiated logics comprises performing a Random Resistant Fault Analysis (RRFA) to detect and identify signals for each instantiated logic of the N instantiated logics having a logic value of 1 or 0 with a high probability of at least 90 percent; and
after said processing is performed, back-annotating a result of said processing to the netlist, wherein said result of said processing comprises the detected and identified signals.

12. The computer program product of claim 11,
wherein said instantiating the N user logics comprises instantiating a first user logic of the N user logics resulting in a first instantiated logic of the N instantiated logics, and
wherein said instantiating the first user logic comprises choosing a naming convention for the first instantiated logic in a same way as it was in an original chip logic hierarchy.

13. The computer program product of claim 11, wherein the netlist includes M non-customized test cells, M being a positive integer.

14. The computer program product of claim 11, wherein each macro test wrapper of the N macro test wrappers comprises a clock splitter circuit, a scan clock gating circuit, a fuse control circuit, an array self test support circuit, and a logic self test support circuit.

15. A computer program product, comprising a computer readable tangible storage device having a computer readable program code embodied stored therein, said computer readable program code configured to be executed by a processor of a computer system to implement a method for designing a circuit, said method comprising:
   providing a netlist of a design, wherein the netlist includes M non-customized test cells, M being a positive integer;
   dividing the netlist into N user logics, N being a positive integer;
   after said dividing the netlist is performed, instantiating the N user logics in N macro test wrappers resulting in N instantiated logics; and
   after said instantiating the N user logics is performed, processing the N instantiated logics,
wherein said processing the N instantiated logics comprises:
   specifying a minimum probability value less than 1;
   locating L test points in the netlist, L being a positive integer not greater than M, wherein each test point of the L test points has a high probability for a logic value selected from the group consisting of 0 and 1, and wherein the high probability is at least the minimum probability value; and
   coupling L non-customized test cells of the M non-customized test cells one-to-one to the L test points resulting in (i) the L non-customized test cells becoming L customized test cells and (ii) each test point of the L test points having a lower probability for the associated logic value than without said coupling netlist.

16. The computer program product of claim 15,
wherein each non-customized test cell of the M non-customized test cells comprises (i) a latch, (ii) a cell AND gate which comprises a first input electrically coupled to the latch and a second input receiving a LBIST (Logic Built-In Self-Test) gate signal, and (iii) a terminator electrically coupled to an output of the cell AND gate, and
wherein the M cell AND gates of the M non-customized test cells are configured to receive the same LBIST gate signal.

* * * * *